United States Patent
Stiens et al.

(10) Patent No.: US 9,206,510 B2
(45) Date of Patent: Dec. 8, 2015

(54) GRAIN BOUNDARY ENGINEERED ALPHA-ALUMINA COATED CUTTING TOOL

(71) Applicant: WALTER AG, Tubingen (DE)

(72) Inventors: Dirk Stiens, Reutlingen (DE); Sakari Ruppi, Tubingen (DE)

(73) Assignee: Walter AG, Tübingen (DE)

( * ) Notice: Subject to any disclaimer, the term of this patent is extended or adjusted under 35 U.S.C. 154(b) by 0 days.

(21) Appl. No.: 14/131,709

(22) PCT Filed: Sep. 17, 2012

(86) PCT No.: PCT/EP2012/068214
§ 371 (c)(1),
(2) Date: Jan. 9, 2014

(87) PCT Pub. No.: WO2013/038000
PCT Pub. Date: Mar. 21, 2013

(65) Prior Publication Data
US 2014/0193622 A1     Jul. 10, 2014

(30) Foreign Application Priority Data

Sep. 16, 2011 (EP) ................................. 11181643

(51) Int. Cl.
*C23C 16/40* (2006.01)
*C23C 16/52* (2006.01)
*C23C 30/00* (2006.01)

(52) U.S. Cl.
CPC ............ *C23C 16/403* (2013.01); *C23C 16/52* (2013.01); *C23C 30/005* (2013.01); *Y10T 428/24975* (2015.01)

(58) Field of Classification Search
USPC ............ 51/307, 309; 428/697, 698, 699, 701, 428/702, 704; 427/255, 255.21
See application file for complete search history.

(56) References Cited

U.S. PATENT DOCUMENTS 4,619,866 A * 10/1986 Smith et al. .................. 428/702
7,442,433 B2    10/2008 Honma et al.
(Continued)

FOREIGN PATENT DOCUMENTS

CN    101468401 A    7/2009
EP    1 655 392       5/2006
(Continued)

OTHER PUBLICATIONS

English translation of Chinese Office Action dated Feb. 10, 2015, for corresponding Patent Application No. 201280035098.3.
(Continued)

*Primary Examiner* — Archene Turner
(74) *Attorney, Agent, or Firm* — Morgan, Lewis & Bockius LLP

(57) ABSTRACT

Cutting tool insert has a substrate and a coating with a total thickness of 5 to 40 μm, the coating being one or more refractory layers of which at least one layer is an $\alpha$-$Al_2O_3$ layer having thickness of 1 to 20 μm. The length of $\Sigma$3-type grain boundaries in the at least one $\alpha$-$Al_2O_3$ layer is more than 80% of the total length of the sum of grain boundaries of $\Sigma$3, $\Sigma$7, $\Sigma$11, $\Sigma$17, $\Sigma$19, $\Sigma$21, $\Sigma$23 and $\Sigma$29-type grain boundaries (grain boundary character distribution measured by EBSD). The at least one $\alpha$-$Al_2O_3$ layer is deposited by chemical vapor deposition (CVD) using reaction gases comprising $H_2$, $CO_2$, $AlCl_3$ and X and optional additions of $N_2$ and Ar, with X being gaseous $H_2S$, $SO_2$, HF, $SF_6$ or combinations thereof. The volume ratio of $CO_2$ and X in the CVD reaction chamber lies within the range $2 < CO_2/X < 10$.

24 Claims, 1 Drawing Sheet

(according to the invention)

(56) References Cited

U.S. PATENT DOCUMENTS

| | | | | |
|---|---|---|---|---|
| 7,455,900 | B2* | 11/2008 | Ruppi | 428/699 |
| 7,597,511 | B2* | 10/2009 | Tomita et al. | 51/307 |
| 8,828,527 | B2* | 9/2014 | Tomita et al. | 428/701 |

FOREIGN PATENT DOCUMENTS

| | | |
|---|---|---|
| EP | 2 409 798 | 1/2012 |
| JP | 2006-326713 | 12/2006 |

OTHER PUBLICATIONS

Prior et al., The Application of Electron Backscatter Diffraction and Orientation Contrast Imaging in the SEM to Textural Problems in Rocks, American Mineralogist, 84, pp. 1741-1759, 1999.

Ruppi, Deposition, Microstructure and Properties of Texture-Controlled CVD Alpha-Al2O3 Coatings, International Journal of Refractory Metals & Hard Materials, 23, pp. 306-316, 2005.

Chien et al., Influence of Microstructure on Residual Thermal Stresses in TiCxN1-x and Alpha-Al2O3 Coatings on WC-Co Tool Inserts, Proceedings of the 17th Plansee Seminar 2009, vol. 2, HM42/1-11.

Brandon et al., The Structure of High-Angle Grain Boundaries, Acta Metallurgica, 14, pp. 1479-1484 (1966).

Grimmer et al., Theoretical and Experimental Descriptions of Grain Boundaries in Rhombohedral Alpha-Al2O3, Philosophical Magazine A, 61:3, pp. 493-509 (1990).

International Preliminary Report on Patentability dated Mar. 27, 2014, for International Application No. PCT/EP2012/068214.

* cited by examiner (according to the invention)

GRAIN BOUNDARY ENGINEERED ALPHA-ALUMINA COATED CUTTING TOOL

FIELD OF THE INVENTION

The present invention relates to a cutting tool insert consisting of a substrate of cemented carbide, cermet, ceramics, steel or a superhard material such as cubic boron nitride (CBN) and a hard coating consisting of one or more refractory layers of which at least one layer is an $\alpha$-$Al_2O_3$ layer, and a method of manufacturing the cutting tool insert.

BACKGROUND OF THE INVENTION

Grain boundaries have a significant influence on material properties such as grain growth, creep, diffusion, electrical, optical and last but not least on mechanical properties. Important properties to be considered are e.g. the density of grain boundaries in the material, the chemical composition of the interface and the crystallographic texture, i.e. the grain boundary plane orientations and grain misorientation. A special role is played by the coincidence site lattice (CSL) grain boundaries. CSL grain boundaries are characterized by the multiplicity index X, which is defined as the ratio between the crystal lattice site density of the two grains meeting at the grain boundaries and the density of sites that coincide when superimposing both crystal lattices. For simple structures, it is generally admitted that grain boundaries with low X values have a tendency for low interfacial energy and special properties. Thus, the control of the proportion of special grain boundaries and of the distribution of grain misorientations inferred from the CSL model can be considered to be important to the properties of ceramics and a way to enhance these properties.

In recent years, a scanning electron microscope (SEM)-based technique known as electron backscatter diffraction (EBSD) has emerged and has been used to study grain boundaries in ceramic materials. The EBSD technique is based on automatic analysis of Kikuchi-type diffraction patterns generated by backscattered electrons. A review of the method is provided by: D. J. Prior, A. P. Boyle, F. Brenker, M. C. Cheadle, A. Day, G. Lopez, L. Peruzzo, G. J. Potts, S. M. Reddy, R. Spiess, N. E. Timms, P. W. Trimby, J. Wheeler, L. Zetterström, The application of electron backscatter diffraction and orientation contrast imaging in the SEM to textural problems in rocks, Am. Mineral. 84 (1999) 1741-1759. For each grain of the material to be studied, the crystallographic orientation is determined after indexing of the corresponding diffraction pattern. Available commercial software makes the texture analyses as well as determination of grain boundary character distribution (GBCD) relatively uncomplicated by using EBSD. Application of EBSD to interfaces has allowed the misorientation of grain boundaries to be characterized for large sample populations of boundaries. Typically the misorientation distribution has been linked to the processing conditions of a material. The grain boundary misorientation is achieved via usual orientation parameters such as, the Euler angles, angle/axis pair, or Rodriquez vector. The CSL model is used widely as characterization tool. Over the last decade a research area known as Grain Boundary Engineering (GBE) has emerged. GBE aims to enhance crystallography of the grain boundaries by developing better process conditions and in such way achieve better materials. EBSD has been recently used to characterize hard coatings, for reference see, H. Chien, Z. Ban, P. Prichard, Y. Liu, G. S. Rohrer, "Influence of Microstructure on Residual Thermal Stresses in $TiC_xN_{1-x}$ and alpha-$Al_2O_3$ Coatings on WC-Co Tool Inserts," Proceedings of the 17th Plansee Seminar 2009 (Editors: L. S. Sigl, P. Rodhammer, H. Wildner, Plansee Group, Austria) Vol. 2, HM 42/1-11.

U.S. Pat. No. 7,442,433 discloses a tool coating where the upper layer is an alumina layer composed of $\alpha$-$Al_2O_3$ having an average layer thickness in the range of 1 to 15 μm, wherein the $\alpha$-$Al_2O_3$ layer has the distribution ratios of $\Sigma 3$ to total $\Sigma N+1$ in the range of 60 to 80% analyzed by using EBSD (N is any even number equal to or greater than two in consideration of the corundum type hexagonal-packed structure, but if an upper limit of N is 28 from the viewpoint of distribution frequencies, even numbers such as 4, 8, 14, 24 and 26 do not exist). The coating is claimed to exhibit excellent chipping resistance in a high-speed intermittent cutting. The deposition of the $\alpha$-$Al_2O_3$ coatings according to U.S. Pat. No. 7,442,433 is performed from the system $H_2$—$CO_2$—$AlCl_3$-$H_2S$, whereby $H_2S$ is applied in the range of 0.1-0.2 vol % and $CO_2$ in the range of 11.2-15 vol %. The ratio $CO_2/H_2S$ is larger than 75 in all the coatings according to U.S. Pat. No. 7,442,433.

OBJECT OF THE INVENTION

It is an object of the present invention is to provide a coated cutting tool having an $\alpha$-$Al_2O_3$ layer that exhibits improved cutting properties, improved chipping resistance and improved crater wear resistance over the prior-art.

DESCRIPTION OF THE INVENTION

The present invention provides a cutting tool insert consisting of a substrate of cemented carbide, cermet, ceramics, steel or a superhard material such as cubic boron nitride (CBN), and a coating with a total thickness of 5 to 40 μm, the coating consisting of one or more refractory layers of which at least one layer is an $\alpha$-$Al_2O_3$ layer having a thickness of 1 to 20 μm, wherein the length of $\Sigma 3$-type grain boundaries in the at least one $\alpha$-$Al_2O_3$ layer is more than 80% of the total length of the sum of grain boundaries of $\Sigma 3$, $\Sigma 7$, $\Sigma 11$, $\Sigma 17$, $\Sigma 19$, $\Sigma 21$, $\Sigma 23$ and $\Sigma 29$-type grain boundaries (=>$\Sigma 3$-29-type grain boundaries), the grain boundary character distribution being measured by EBSD.

The coating of the cutting tool insert of the present invention comprises a new, improved alumina layer where the $\alpha$-$Al_2O_3$ phase consists of as-deposited $\alpha$-$Al_2O_3$ wherein $\Sigma 3$-type grain boundaries dominate the grain boundary character distribution measured by EBSD. It has surprisingly been found that improved cutting properties, improved chipping resistance and improved crater wear resistance of the cutting tool insert can be achieved if more than 80% of the total length of the sum of grain boundaries of $\Sigma 3$-29-type grain boundaries be $\Sigma 3$-type of grain boundaries. As will be discussed in connection with the method of the present invention, the inventive dominating $\Sigma 3$-type grain boundary character distribution measured by EBSD can be controlled by particular deposition conditions. The present invention enhances the properties of $\alpha$-$Al_2O_3$ coatings by sophisticated Grain Boundary Engineering (GBE), so that extremely high amounts of $\Sigma 3$-type of grain boundaries can be obtained.

In a preferred embodiment of the cutting tool insert of the present invention the length of $\Sigma 3$-type grain boundaries in the at least one $\alpha$-$Al_2O_3$ layer is from 82% to 99%, or from 84% to 97%, or from 86% to 92% of the total length of the sum of grain boundaries of $\Sigma 3$-29-type grain boundaries, the grain boundary character distribution being measured by EBSD. it is very preferred if the length of $\Sigma 3$-type grain boundaries in the at least one α-Al$_2$O$_3$ layer is more than 95% of the total length of the sum of grain boundaries of Σ3-29-type grain boundaries.

In another preferred embodiment of the cutting tool insert of the present invention the coating comprises a first layer adjacent to the substrate surface, the first layer consisting of carbide, nitride, carbonitride or oxycarbonitride of one or more of Ti, Zr, V and Hf, or combinations thereof deposited using CVD or MT-CVD, having a thickness of from 1 to 20 μm, preferably from 5 to 10 μm, preferably the first layer consisting of titanium carbonitride, Ti(CN). It has been found that this type of layer in combination with the inventive type of α-Al$_2$O$_3$ layer provides an improved flank wear resistance to the cutting tool insert of the present invention.

In yet another preferred embodiment of the cutting tool insert of the present invention the coating comprises an intermediate layer between the substrate surface and the first layer, the intermediate layer consisting of titanium nitride, TiN, deposited using CVD or MT-CVD, and having a thickness of less than 5 μm, preferably from 0.3 to 3 μm, more preferably from 0.5 to 2 μm. It has been found that providing this type of intermediate layer between the substrate surface and the first layer improves the adhesion of the first layer, and thus, also the adhesion of the α-Al$_2$O$_3$ layer of the present invention.

Preferably, the α-Al$_2$O$_3$ layer of the present invention is deposited directly on top of said first layer. However, one or more additional intermediate layers between the first layer and the α-Al$_2$O$_3$ layer can also be provided according to the present invention.

In yet another preferred embodiment of the cutting tool insert of the present invention
a) the uppermost layer of the coating is the α-Al$_2$O$_3$ layer or
b) the uppermost layer of the coating is a layer of carbide, nitride, carbonitride or oxycarbnitride of one or more of Ti, Zr, V and Hf, or combinations thereof (top coating), having a thickness of from 0.5 to 3 μm, preferably 0.5 to 1.5 μm, being deposited atop of the α-Al$_2$O$_3$ layer or
c) surface areas of the cutting tool insert, preferably the rake face of the cutting tool insert, comprise the α-Al$_2$O$_3$ layer a) as the uppermost layer whereas the remaining surface areas of the cutting tool insert comprise as the uppermost layer a layer b) of carbide, nitride, carbonitride or oxycarbnitride of one or more of Ti, Zr, V and Hf, or combinations thereof, having a thickness of from 0.5 to 3 μm, preferably 0.5 to 1.5 μm, being deposited atop of the α-Al$_2$O$_3$ layer.

The top coating layer atop the α-Al$_2$O$_3$ layer can be provided as a wear indicator or as a layer of other functions. Embodiments, where only parts of the surface areas of the cutting tool insert, preferably the rake face of the cutting tool insert, comprise the α-Al$_2$O$_3$ layer as the uppermost layer whereas the remaining surface areas are covered with the top coating as the outermost layer, can be produced by removing the deposited top coating by way of blasting or any other well known method.

In yet another preferred embodiment of the cutting tool insert of the present invention the substrate consists of cemented carbide, preferably of cemented carbide consisting of 4 to 12 wt-% Co, optionally 0.5-10 wt-% cubic carbides of the metals from groups IVb, Vb and VIb of the periodic table, preferably Ti, Nb, Ta or combinations thereof, and balance WC.

For steel machining applications the cemented carbide substrate preferably contains 7.0 to 9.0 wt-% cubic carbides of the metals from groups IVb, Vb and VIb of the periodic table, preferably Ti, Nb and Ta, and for cast iron machining applications the cemented carbide substrate preferably contains 0.3 to 3.0 wt-% cubic carbides of the metals from groups IVb, Vb and VIb of the periodic table, preferably Ti, Nb and Ta.

In yet another preferred embodiment of the cutting tool insert of the present invention the substrate consists of cemented carbide comprising a binder phase enriched surface zone having a thickness of 5 to 30 μm, preferably 10 to 25 μm, from the substrate surface, the binder phase enriched surface zone having a Co content that is at least 1.5 times higher than in the core of the substrate and having a content of cubic carbides that is less than 0.5 times the content of cubic carbides in the core of the substrate. The thickness of the α-Al$_2$O$_3$ layer in this embodiment is preferably about 4 to 12 μm, most preferably 4 to 8 μm.

Preferably, the binder phase enriched surface zone of the cemented carbide body is essentially free from cubic carbides. The binder enriched surface zone enhances toughness of the substrate and widens the application range of the tool. Substrates having a binder enriched surface zone are particularly preferred for cutting tool inserts for metal cutting operations in steel, whereas cutting tool inserts for metal cutting operations in cast iron are preferably produced without binder enriched surface zone.

The present invention further provides a method of manufacturing a cutting tool insert as defined herein wherein said at least one α-Al$_2$O$_3$ layer is deposited by chemical vapour deposition (CVD) the reaction gas of the CVD process comprising H$_2$, CO$_2$, AlCl$_3$ and X and optional additions of N$_2$ and Ar, with X being gaseous H$_2$S, SO$_2$, SF$_6$ or combinations thereof, wherein the volume ratio of CO$_2$ and X in the CVD reaction chamber lies within the range of 2<CO$_2$/X<10.

It has surprisingly been found that the inventive dominating Σ3-type grain boundary character distribution obtained by EBSD can be controlled by particular deposition conditions. The inventive kind of Σ3-type grain boundary character can be achieved by the control of the volume ratio of CO$_2$ and X in the CVD reaction during deposition of α-Al$_2$O$_3$. If the volume ratio CO$_2$/X is lower than 2 the growth rate of the α-Al$_2$O$_3$ layer will be too low. If the volume ratio CO$_2$/X is higher than 10 the amount of Σ3-type grain boundaries will be reduced.

In a preferred embodiment of the method of the present invention the volume ratio of CO$_2$ and X in the CVD reaction chamber lies within the range of 3<CO$_2$/X<8, preferably 4<CO$_2$/X<6. It has been found that the amount of Σ3-type grain boundaries can be further increased if the volume ratio CO$_2$/X lies within these preferred ranges, especially in the presence of SO$_2$.

In another preferred embodiment of the method of the present invention the volume proportion of the component X or the combination of components X in the CVD reaction chamber lies within the range of 0.2 vol % to 5.0 vol %, preferably 0.5 vol % to 3.0 vol % and more preferably 0.6 vol % to 2.0 vol %, of the total volume of gases in the CVD reaction chamber.

If the volume proportion of the component X is lower than 0.2 vol % typically a too low deposition rate will be obtained. If H$_2$S is used too high levels of H$_2$S should, in principle, be avoided since this H$_2$S is a flammable and extremely hazardous gas. Air must be tested for the presence and concentration of H$_2$S by a qualified person using air monitoring equipment, such as hydrogen sulfide detector or a multi-gas meter that detects the gas. Fire and explosion precautions are also necessary.

In yet another preferred embodiment of the method of the present invention the volume ratio of CO$_2$/AlCl$_3$ in the CVD reaction chamber is equal or smaller than 1.5 and/or the volume ratio of $AlCl_3/HCl$ in the CVD reaction chamber is equal or smaller than 1. It has surprisingly been found that the limitation of the volume ratio of $CO_2/AlCl_3$ in the CVD reaction chamber to a maximum of 1.5 can contribute to the formation of high amounts of Σ3-type of grain boundaries. It has further been found that the limitation of the volume ratio of $AlCl_3/HCl$ in the CVD reaction chamber to a maximum of 1.0 can also contribute to the formation of high amounts of Σ3-type of grain boundaries. If both conditions are met, the formation of Σ3-type of grain boundaries can even be improved.

In yet another preferred embodiment of the method of the present invention the component X in the CVD process is $H_2S$ or $SO_2$ or a combination of $H_2S$ and $SO_2$, whereby, if the component X in the CVD process is a combination of $H_2S$ and $SO_2$, the volume proportion of $SO_2$ does not exceed 20% of the volume amount of $H_2S$. It has been found that, if the amount $SO_2$ in the combination of $H_2S$ and $SO_2$ exceeds 20% of the volume amount of $H_2S$, the coating uniformity was reduced resulting in the so-called "dog-bone effect".

In yet another preferred embodiment of the method of the present invention the reaction gas of the CVD process comprises additions of $N_2$ and/or Ar in a volume amount in the range of 4 to 20 vol %, preferably 10 to 15 vol %, of the total volume of gases in the CVD reaction chamber.

In yet another preferred embodiment of the method of the present invention the CVD process is conducted at a temperature in the range of 850 to 1050° C., preferably 950 to 1050° C., most preferably 980 to 1020° C. and/or the CVD process is conducted at a reaction gas pressure in the range 50 to 120 mbar, preferably 50 to 100 mbar.

By depositing the $\alpha\text{-}Al_2O_3$ layer according to the method of the present invention the amount Σ3-type grain boundaries can be controlled so that the total length of Σ3-type grain boundaries is more than 80% of the total length of the sum of grain boundaries of Σ3, Σ7, Σ11, Σ17, Σ19, Σ21, Σ23 and Σ29-type grain boundaries (=Σ3-29-type grain boundaries). As will be shown in the examples below, these kinds of coatings exhibit an excellent chipping resistance in a high-speed intermittent cutting and enhanced crater wear resistance in continuous turning over the prior-art coatings.

EBSD Sample Treatment and Measurement

For the present invention the distribution of grain boundaries was studied by EBSD as described herein. The EBSD technique is based on automatic analysis of Kikuchi-type diffraction patterns generated by backscattered electrons. For reference see: D. J. Prior, A. P. Boyle, F. Brenker, M. C. Cheadle, A. Day, G. Lopez, L. Peruzzo, G. J. Potts, S. M. Reddy, R. Spiess, N. E. Timms, P. W. Trimby, J. Wheeler, L. Zetterström, The application of electron backscatter diffraction and orientation contrast imaging in the SEM to textural problems in rocks, Am. Mineral. 84 (1999) 1741-1759. For each grain, the crystallographic orientation is determined after indexing of the corresponding diffraction pattern. Commercially available software was applied.

The surfaces of the alumina coatings were prepared for EBSD. The coating surfaces were first polished subsequently using slurries of diamond having average grain sizes of 3 μm and 1 μm, respectively. Then, the samples were polished using colloidal silica having an average grain size of 0.04 μm. Care was taken to ensure that the polished surfaces were smooth and parallel to the original coating surface. Finally, the specimens were ultrasonically cleaned before EBSD examination.

After cleaning the polished surfaces of the $\alpha\text{-}Al_2O_3$ coatings were studied by SEM equipped with EBSD. The SEM used was a Zeiss Supra 55 VP with a HKL NL02 EBSD detector. The EBSD data were collected sequentially by positioning the focused electron beam on each pixel individually. The normal of the sample surface was tilted 70° to the incident beam and analysis was carried out at 15 kV. Pressure of 10 Pa was applied to avoid charging effects. High current mode was used together with 60 μm or 120 μm apertures. Acquisitions were made on polished surfaces with steps of 0.1 μm/step for 500×300 points, corresponding to a surface area of 50×30 μm. The data processing was made with and without noise filtering. Noise filtering and grain boundary character distributions were determined using commercial software. The analysis of grain boundary character distributions was based on available the data from Grimmer (H. Grimmer, R. Bonnet, Philosophical Magazine A 61 (1990) 493-509). Brandon criterion ($\Delta\Theta<\Theta_0 (\Sigma)^{-0.5}$, where $\Theta_0=15°$ was used to account for the allowed deviations $\Delta\Theta$ of experimental values from the theoretical values (D. Brandon *Acta metall.* 14 (1966) 1479-1484.) Special grain boundaries corresponding to given Σ-values were counted and expressed as a fraction of the total grain boundaries.

For the purpose of the present invention and the definitions herein, Σ-values for the calculation of Σ-type grain boundaries are based on EBSD data without noise reduction. Care should be taken that specimen preparation is carried out as described here with sufficient smoothness. The software used for the purpose of the present invention was a HKL acquisition software named Flamenco, version 5.0.9.0, from Oxford Instruments. For grain boundary analysis there was used a HKL post process software named Tango from Oxford Instruments.

EXAMPLES

Example 1

$\alpha\text{-}Al_2O_3$ Coatings

Figure 1:
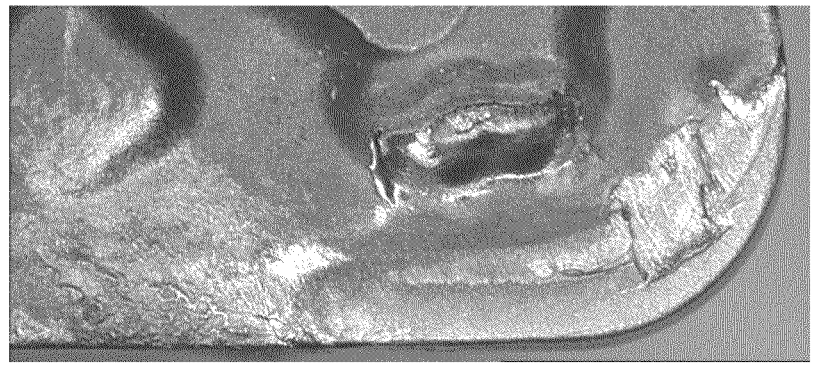
FIG. 1 Rake face of the cutting insert with coating 2 according to prior art after turning test according to example 3.

Cemented carbide substrates for cutting inserts with a composition of 6.0 wt % Co and balance WC (hardness about 1600 HV) were coated with a Ti(C,N) layer by applying MT-CVD using 0.6 vol % $CH_3CN$, 3.8 vol % $TiCl_4$, 20 vol % $N_2$ and balance $H_2$. The thickness of the Ti(C,N) MT-CVD layer was about 5 μm.

Onto this Ti(C,N) layer of separate substrate samples 7 different layers consisting of about 8 μm $\alpha\text{-}Al_2O_3$ were deposited by applying CVD referred to here as coatings 1 to 7. The following insert geometries were coated: SNUN140408 (especially for EBSD Studies), CNMG120412, WNMG080412-NM4, WNMG080416-NM9, DNMG150608-NM4. The coating parameters are given in Table 1 for $\alpha\text{-}Al_2O_3$.

The deposition of $\alpha\text{-}Al_2O_3$ was started by depositing a 0.05 μm to about 1 μm, preferably 0.5 μm to about 1 μm, thick bonding layer on top of the MTCVD layer from the system $H_2$—$N_2$—CO—$TiCl_4$—$AlCl_3$ at a pressure of 50 to 100 mbar. For the preparation of the bonding layer the MTCVD layer was treated with a gas mixture of 3 vol % $TiCl_4$, 0.5 vol % $AlCl_3$, 4.5 vol % CO, 30 vol % $N_2$ and balance $H_2$ for about 30 min at a temperature of about 1000° C. The deposition was followed by a purge of 10 min using $H_2$ before starting the next step.

$\alpha$-$Al_2O_3$ was nucleated on the (Ti,Al)(C,N,O) bonding layer by treating said layer with a gas mixture of 4 vol % $CO_2$, 9 vol % CO, 25 vol % $N_2$, balance $H_2$ for 5-10 min at a temperature from about 750 to 1050° C., preferably at about 980 to 1020° C. and most preferably at 1000 to 1020° C. (P=80 to 100 mbar). The oxidation was followed by a purge of 10 min using Ar.

The alumina deposition was started with by introducing a gas mixture of $AlCl_3$, $CO_2$, $Ar_2$, $N_2$ HCl and $H_2$, in the volume amounts as indicated in table 1, without precursor X for about 10 min at a temperature of about 1000° C. These precursors were shunted in simultaneously except HCl. HCl flow was shunted into the reactor 2 min after the start (8 min before X was introduced).

TABLE 1

Coating Parameters for $\alpha$-$Al_2O_3$

| Coating | $CO_2$ [vol %] | $SO_2$ [vol %] | $H_2S$ [vol %] | $AlCl_3$ [vol %] | HCl [vol %] | $N_2$ [vol %] | Ar [vol %] | $H_2$ [vol %] | $CO_2$/X ratio |
|---|---|---|---|---|---|---|---|---|---|
| 1 (prior art) | 11 | — | 0.1 | 7.5 | 3.5 | — | — | balance | 110 |
| 2 (prior art) | 15 | — | 0.2 | 11.0 | 5.0 | — | — | balance | 75 |
| 3 (prior art) | 4 | — | 0.1 | 2.7 | 1.0 | — | — | balance | 40 |
| 4 (invention) | 3 | 0.04 | 0.4 | 2.0 | 1.0 | 6 | 3 | balance | 6.8 |
| 5 (invention) | 3 | 0.1 | 1.0 | 2.2 | 2.2 | 6 | 3 | balance | 2.7 |
| 6 (invention) | 3 | 0.06 | 0.6 | 2.0 | 2.0 | 6 | 3 | balance | 4.5 |
| 7 (invention) | 3 | — | 0.6 | 2.0 | 2.0 | — | — | balance | 5 |

Example 2

EBSD Examination

The alumina layers of the samples of Example 1 were polished and cleaned, and then EBSD measurements were made, as described above for EBSD sample treatment and measurement.

The results of the EBSD measurements in respect of the relative amounts of $\Sigma3$-type grain boundaries are given in Table 2 for data without and with noise reduction. As can be seen in Table 2 the amount of $\Sigma3$-type grain boundaries to the total $\Sigma3$-29-type grain boundaries decreases as a result of noise reduction. The reduction as a result of noise reduction is larger for the prior art coatings with lower proportion of $\Sigma3$-type grain boundaries.

TABLE 2

% $\Sigma3$-type grain boundaries to the total $\Sigma3$-29-type grain boundaries with and without noise reduction

| Coating | $\Sigma3$ to the total $\Sigma3$-29 (%) (without noise reduction) | $\Sigma3$ to the total $\Sigma3$-29 (%) (with noise reduction) |
|---|---|---|
| 1 (prior art) | 56 | 51 |
| 2 (prior art) | 64 | 53 |
| 3 (prior art) | 71 | 64 |
| 4 (invention) | 88 | 86 |
| 5 (invention) | 92 | 90 |
| 6 (invention) | 99 | 97 |
| 7 (invention) | 84 | 82 |

Example 3

Turning Tests

Coatings 2 and 6 of Example 1 deposited on WNMG080412-NM4 inserts were tested in carbon steel (C45) without coolant using the following cutting parameters:
Geometry: WNMG080412-NM4
Cutting speed (vc)=280 m/min
Feed (f)=0.32 mm/rev
Depth of cut (ap)=2.5 mm.

Figure 2:
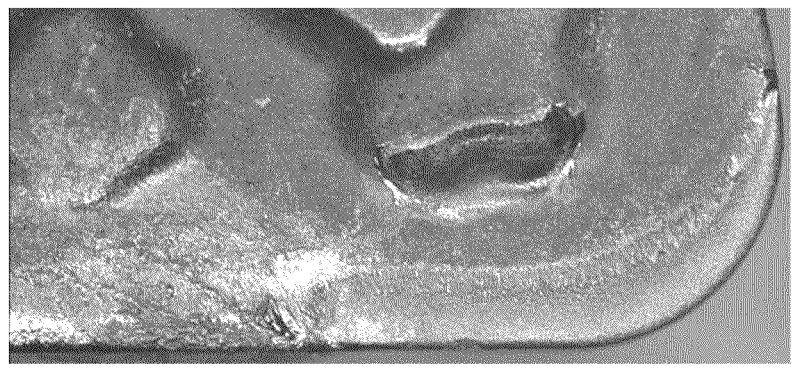
FIG. 2 Rake face of the cutting insert with coating 6 according to the present invention after turning test according to example 3.

The rake faces of the inserts are shown in FIG. 1 (coating 2—prior art) and FIG. 2 (coating 6—invention) after turning for 12 min. The insert according to the invention showed considerably less crater wear.

Example 4

Turning Tests

Coatings 3, 6 and 7 of Example 1 deposited on WNMG080412-NM4 inserts were tested in carbon steel (C45) without coolant using the following cutting parameters:
Geometry: WNMG080412-NM4
Cutting speed ($v_c$)=220 m/min
Feed (f)=0.32 mm/rev
Depth of cut ($a_p$)=2.5 mm.

The tool lives are shown in table 3. The inserts with coatings 6 and 7 containing high proportion of $\Sigma3$-type grain boundaries (invention) showed superior resistance to crater wear.

TABLE 3

Turning Test results

| Coating | Tool Life (min) |
|---|---|
| 3 (prior art) | 13.5 |
| 6 (invention) | 21 |
| 7 (invention) | 18 |

Example 5

Edge Toughness Tests

Coatings 3, 6 and 7 of Example 1 deposited on CNMG120412 inserts were tested with respect to edge toughness (chipping resistance) in longitudinal turning of cast iron (GG25) using the following cutting parameters:

Insert geometry: CNMG120412
Cutting speed: $v_c$=300 m/min
Feed (f)=0.32 mm/rev
Depth of cut: $a_p$=2.5 mm The inserts were inspected after 4 and 8 minutes of cutting. As shown in Table 4, compared to the coating of the prior art, the edge toughness was considerably enhanced when the coating was produced according to this invention.

TABLE 4

Edge Toughness

| Coating | Flaking of the edge line (%) after 4 minutes | Flaking of the edge line (%) after 8 minutes |
|---|---|---|
| 3 (prior art) | 4 | 22 |
| 6 (invention) | 0 | 8 |
| 7 (invention) | 2 | 13 |

The invention claimed is:

1. A cutting tool insert consisting of:
    a substrate of cemented carbide, cermet, ceramics, steel or a superhard material; and
    a coating with a total thickness of 5 to 40 µm, the coating consisting of one or more refractory layers of which at least one layer is an α-$Al_2O_3$ layer having a thickness of 1 to 20 µm,
    wherein the length of Σ3-type grain boundaries in the at least one α-$Al_2O_3$ layer is more than 80% of the total length of the sum of grain boundaries of Σ3, Σ7, Σ11, Σ17, Σ19, Σ21, Σ23 and Σ29-type grain boundaries (=Σ3-29-type grain boundaries), the grain boundary character distribution being measured by EBSD.

2. The cutting tool insert of claim 1 wherein the length of Σ3-type grain boundaries in the at least one α-$Al_2O_3$ layer is from 82% to 99% of the total length of the sum of grain boundaries of Σ3-29-type grain boundaries, the grain boundary character distribution being measured by EBSD.

3. The cutting tool insert of claim 1 wherein the coating comprises a first layer adjacent to the substrate surface, the first layer consisting of carbide, nitride, carbonitride or oxycarbonitride of one or more of Ti, Zr, V and Hf, or combinations thereof deposited using CVD or MT-CVD, having a thickness of from 1 to 20 µm.

4. The cutting tool insert of claim 3 wherein the coating comprises an intermediate layer between the substrate surface and the first layer, the intermediate layer consisting of titanium nitride, TiN, deposited using CVD or MT-CVD, and having a thickness of less than 5 µm.

5. The cutting tool insert of claim 3 wherein the α-$Al_2O_3$ layer is deposited on top of said first layer.

6. The cutting tool insert of claim 1 wherein
    a) the uppermost layer of the coating is the α-$Al_2O_3$ layer or
    b) the uppermost layer of the coating is a layer of carbide, nitride, carbonitride or oxycarbonitride of one or more of Ti, Zr, V and Hf, or combinations thereof, having a thickness of from 0.5 to 3 µm and being deposited atop of the α-$Al_2O_3$ layer or
    c) surface areas of the cutting tool insert comprise the α-$Al_2O_3$ layer as the uppermost layer whereas the remaining surface areas of the cutting tool insert comprise as the uppermost layer a layer of carbide, nitride, carbonitride or oxycarbonitride of one or more of Ti, Zr, V and Hf, or combinations thereof, having a thickness of from 0.5 to 3 µm and being deposited atop of the α-$Al_2O_3$ layer.

7. The cutting tool insert of claim 1 wherein the substrate consists of cemented carbide optionally 0.5-10 wt-% cubic carbides of the metals from groups IVb, Vb and VIb of the periodic table and balance WC.

8. The cutting tool insert of claim 1 wherein the substrate consists of cemented carbide comprising a binder phase enriched surface zone having a thickness of 5 to 30 µm from the substrate surface, the binder phase enriched surface zone having a Co content that is at least 1.5 times higher than in the core of the substrate and having a content of cubic carbides that is less than 0.5 times the content of cubic carbides in the core of the substrate.

9. A method of manufacturing a cutting tool insert of claim 1, comprising:
    depositing said at least one α-$Al_2O_3$ layer by chemical vapour deposition (CVD),
    wherein the reaction gas of the CVD process comprises $H_2$, $CO_2$, $AlCl_3$ and X and optional additions of $N_2$ and Ar, with X being gaseous $H_2S$, $SO_2$, $SF_6$ or combinations thereof, and
    wherein the volume ratio of $CO_2$ and X in the CVD reaction chamber lies within the range of 3<$CO_2$/X<10.

10. The method of claim 9, wherein the volume ratio of $CO_2$ and X in the CVD reaction chamber lies within the range of 3<$CO_2$/X<8.

11. The method of claim 9, wherein the volume proportion of the component X or the combination of components X in the CVD reaction chamber lies within the range of 0.2 vol % to 5.0 vol % of the total volume of gases in the CVD reaction chamber.

12. The method of claim 9, wherein the volume ratio of $CO_2$/$AlCl_3$ in the CVD reaction chamber is equal or smaller than 1.5 and/or the volume ratio of $AlCl_3$/HCl in the CVD reaction chamber is equal or smaller than 1.

13. The method of claim 9, wherein the component X in the CVD process is $H_2S$ or $SO_2$ or a combination of $H_2S$ and $SO_2$, whereby, if the component X in the CVD process is a combination of $H_2S$ and $SO_2$, the volume proportion of $SO_2$ does not exceed 20% of the volume amount of $H_2S$.

14. The method of claim 9 wherein the reaction gas of the CVD process comprises additions of $N_2$ and/or Ar in a volume amount in the range of 4 to 20 vol % of the total volume of gases in the CVD reaction chamber.

15. The method of claim 9, wherein the CVD process is conducted at a temperature in the range of 850 to 1050° C. and/or the CVD process is conducted at a reaction gas pressure in the range 50 to 120 mbar.

16. The cutting tool insert of claim 2 wherein the length of Σ3-type grain boundaries in the at least one α-$Al_2O_3$ layer is from 84% to 97% of the total length of the sum of grain boundaries of Σ3-29-type grain boundaries, the grain boundary character distribution being measured by EBSD.

17. The cutting tool insert of claim 16 wherein the length of Σ3-type grain boundaries in the at least one α-$Al_2O_3$ layer is from 86% to 92% of the total length of the sum of grain boundaries of Σ3-29-type grain boundaries, the grain boundary character distribution being measured by EBSD.

18. The cutting tool insert of claim 3 wherein the thickness of the first layer is from 5 to 10 µm.

19. The cutting tool insert of claim 3 wherein the first layer consists of titanium carbonitride, Ti(CN).

20. The cutting tool insert of claim 4 wherein the thickness of the intermediate layer is from 0.3 to 3 µm.

21. The method of claim 10, wherein the volume ratio of $CO_2$ and X in the CVD reaction chamber lies within the range of 4<$CO_2$/X<6.

22. The method of claim 11 wherein the volume proportion of the component X or the combination of components X in the CVD reaction chamber lies within the range of 0.5 vol % to 3.0 vol % of the total volume of gases in the CVD reaction chamber.

23. The method of claim 22 wherein the volume proportion of the component X or the combination of components X in the CVD reaction chamber lies within the range of 0.6 vol % to 2.0 vol % of the total volume of gases in the CVD reaction chamber.

24. The method of claim 14, wherein the volume amount of $N_2$ and/or Ar is in the range of 10 to 15 vol % of the total volume of gases in the CVD reaction chamber.

* * * * *